United States Patent [19]

Enomoto et al.

[11] Patent Number: 5,577,922

[45] Date of Patent: Nov. 26, 1996

[54] CARD-EDGE CONNECTOR WITH EJECTION MECHANISM

[75] Inventors: Ikuo Enomoto, Machida; Toshitaka Kusuhara, Yokohama, both of Japan

[73] Assignee: The Whitaker Corporation, Wilmington, Del.

[21] Appl. No.: 401,544

[22] Filed: Mar. 8, 1995

[30] Foreign Application Priority Data

Apr. 28, 1994 [JP] Japan .................. 6-113549

[51] Int. Cl.⁶ .................. H01R 13/633; H01R 23/68
[52] U.S. Cl. .................. 439/157; 439/160
[58] Field of Search .................. 439/152–160, 439/372

[56] References Cited

U.S. PATENT DOCUMENTS

| | | | |
|---|---|---|---|
| 4,070,081 | 1/1978 | Takahashi | 339/91 R |
| 4,178,051 | 12/1979 | Kocher et al. | 339/45 M |
| 4,241,966 | 12/1980 | Gomez | 339/45 M |
| 4,410,222 | 10/1983 | Enomota et al. | 339/17 F |
| 4,447,101 | 5/1984 | Gugliotti | 339/45 M |
| 4,579,408 | 4/1986 | Sasaki | 339/45 M |
| 4,648,009 | 3/1987 | Beun et al. | 361/399 |
| 4,761,141 | 8/1988 | Hawk et al. | 439/153 |
| 4,778,401 | 10/1988 | Boudreau et al. | 439/157 |
| 5,139,435 | 8/1992 | Komatsu et al. | 439/159 |
| 5,145,389 | 9/1992 | Okubo | 439/159 |
| 5,162,002 | 11/1992 | Regnier | 439/637 |
| 5,383,789 | 1/1995 | Watanabe | 439/159 |
| 5,429,523 | 7/1995 | Tondreault | 439/157 |
| 5,470,241 | 11/1995 | Kauffman et al. | 439/159 |

FOREIGN PATENT DOCUMENTS

| | | |
|---|---|---|
| 0575832A1 | 12/1993 | European Pat. Off. . |
| 0580983A1 | 2/1994 | European Pat. Off. . |
| 6-88070 | 12/1994 | Japan . |
| 2251134 | 6/1992 | United Kingdom . |
| 2282277 | 3/1995 | United Kingdom . |

Primary Examiner—David L. Pirlot

[57] ABSTRACT

A card-edge connector with an ejection mechanism used for making electrical connection between a mother board and a card, which is inserted between two guide posts and which can be ejected from the connector. The card inserted between the guide posts is ejected by means of the ejection mechanism. The card-ejection mechanism comprises a push bar and a cam member. The push bar can move rectilinearly inside a guide post to release the card with the cam member transforming the movement of the push bar into rotational movement, resulting in the application of an ejection force to a corner of the card.

11 Claims, 9 Drawing Sheets

5,577,922

CARD-EDGE CONNECTOR WITH EJECTION MECHANISM

FIELD OF THE INVENTION

This invention relates to card-edge connectors, especially to card-edge connectors having mechanisms for ejection of cards therefrom.

BACKGROUND OF INVENTION

In recent years, card-edge connectors are finding extensive use in computers and other electronic devices where they are used for making electrical connections with conductive pads formed on one or both sides of a printed circuit card along its edge, when it is inserted in such a connector.

Card-edge connectors are designed for connection and removal of cards with electronic components mounted on them, and some of them are equipped with an ejection mechanism providing for a smooth removal of the card. This is done to facilitate removal of such cards and to prevent electronic components from accidental damage. An example of a card-edge connector with a rotational ejection mechanism can be found in Japanese Patent Publication 93-217642. The housing of this connector has a rotary lever arm. The lever arm has an element engaging the printed circuit card which ejects it when the lever arm is rotated.

However, the lever arm of the above card-edge connector is difficult to operate because it is located relatively close to the mother board, and since the lever arm is rotary, it takes more space, thus reducing the effective use of the space. Therefore, it is desirable to have a card-edge connector with an ejection mechanism which can provide for a reliable connection of a card and its smooth removal, while making it possible to effectively use the space on the mother board. Important considerations in the overall reduction of the dimensions of electronic equipment are effective use of space and relative flexibility in the selection of locations where the connector can be mounted.

This invention takes into consideration the above mentioned need and its purpose is to provide a card-edge connector with an ejection mechanism that provides smooth ejection of the card, reliable card retention and requires less space then what is currently available.

SUMMARY OF THE INVENTION

The card-edge connector with an ejection mechanism according to this invention has a connector housing containing electrical contacts and a pair of guide posts located at both ends of the housing. At least one of these guide posts has an ejection mechanism. The ejection mechanism includes a push bar moving inside a straight guiding groove in a guide post and a cam member linked to it by means of a pivoting joint. When the cam member is turned, it pushes a corner of the edge of the card inserted in the card-edge connector, thus ejecting the card. This invention also has a retaining device for a positive retention of the card which is released when the push bar is activated.

BRIEF DESCRIPTION OF THE DRAWINGS

Embodiments of the invention will now be described by way of example with reference to the accompanying drawings in which.

DETAILED DESCRIPTION OF THE INVENTION

Figure 7:
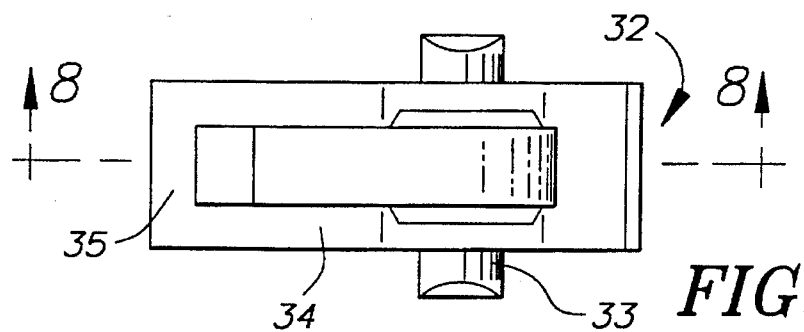
FIG. 7 is a top view of a cam member used in the card-ejection mechanism of FIG. 1.
Figure 8:
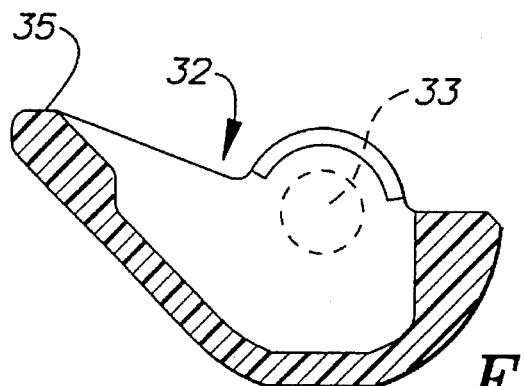
FIG. 8 is a cross-sectional view taken along line 8—8 of FIG. 7.
Figure 9:
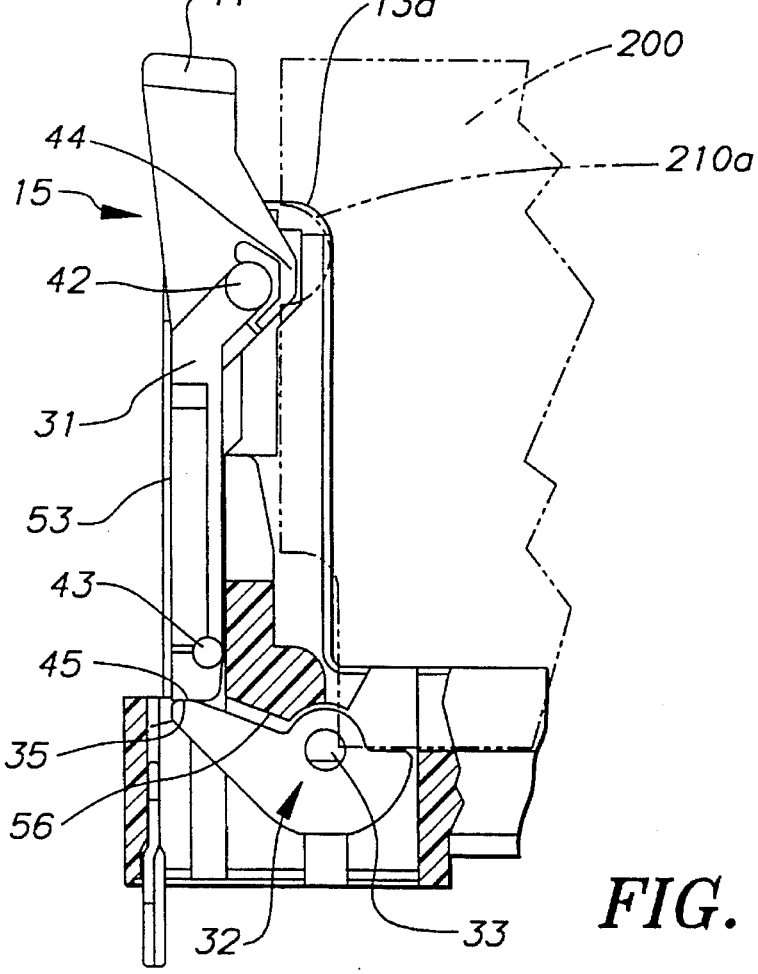
FIG. 9 is a partly-sectioned view of the guide post showing positions of the components of the card-ejection mechanism of FIG. 1 when a card is fully inserted in the connector.

FIGS. 1–11 represent a first embodiment of a cardedge connector 10 with an ejection mechanism 15. As can be seen from FIGS. 1–4, card-edge connector 10 according to this invention includes a dielectric housing 10a having a connector section 12 with electrical contacts 11a and 11b secured therein and guide posts 13a and 13b located at both ends of the connector section 12. The guide posts 13a and 13b guide a card 200 into the connector section 12 (FIG. 9). When the card 200 is fully inserted, its electrical contacts form electrical connections with contacts 11a and 11b, thus completing electrical connection of the card with the mother board (not shown) to which the card-edge connector 10 is to be mounted.

Figure 1:
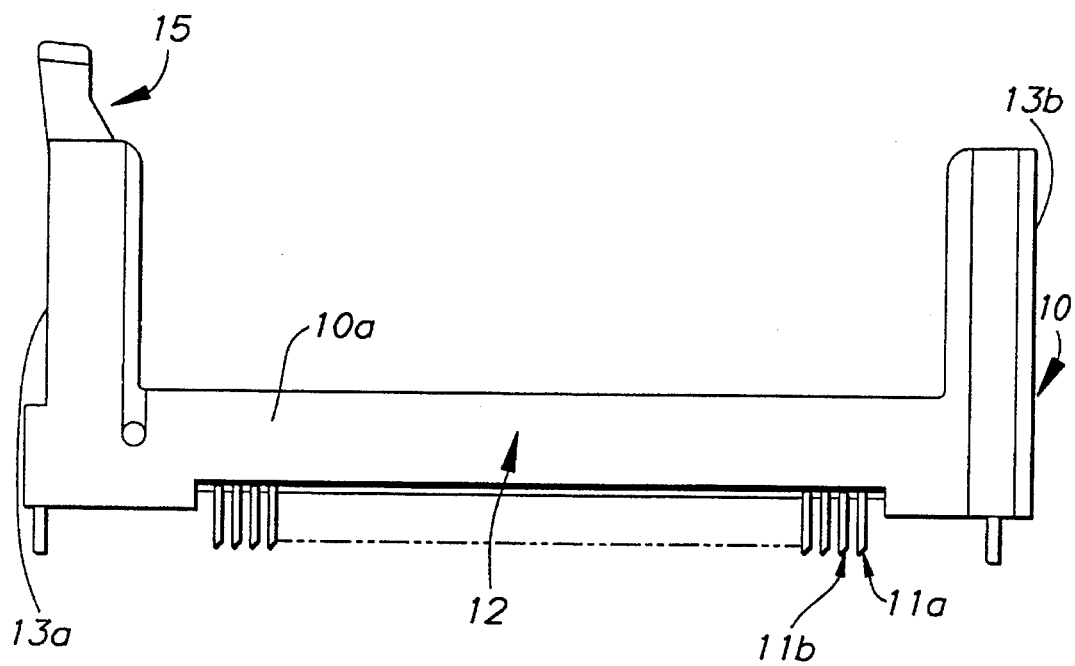
FIG. 1 is a side view of a first embodiment of the card-edge connector with an ejection mechanism.

As can be seen from FIGS. 1,2 and 9–11, at least one of the guiding posts 13a or 13b has an ejection mechanism 15 provided for the ejection of the card 200. In the first embodiment, as shown in FIG. 1, the ejection mechanism 15 is provided only in the left guide post 13a.

Figure 2:
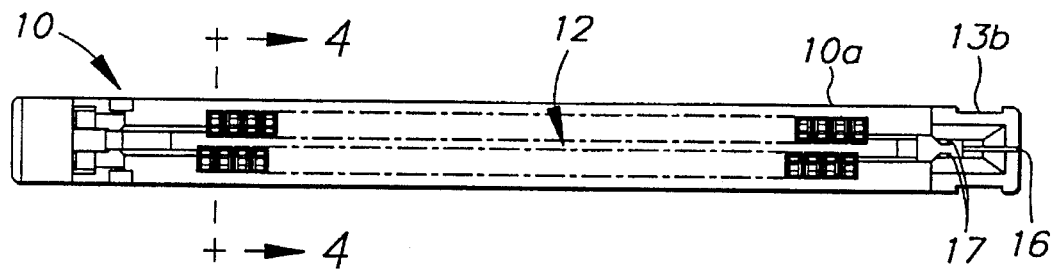
FIG. 2 is a top view of the connector of FIG. 1.
Figure 3:
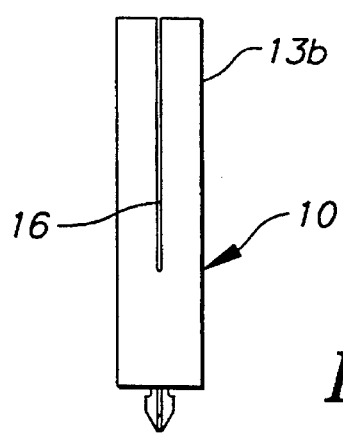
FIG. 3 is a right hand view of the connector of FIG. 1.

As shown in FIG. 3, the guide post 13b without an ejection mechanism has a slot 16 in its side and mutually-opposed lugs 17 on the inside surfaces which can be seen in FIG. 2. Due to the slot 16, the guide post 13b has certain flexibility in the sideways direction. Lugs 17 of the guide post 13b become engaged with a notch in the card 200, thus retaining it in the connector. The slot 16 and lugs 17 are described in Japanese Utility Model Publication 93-28846.

Figure 4:
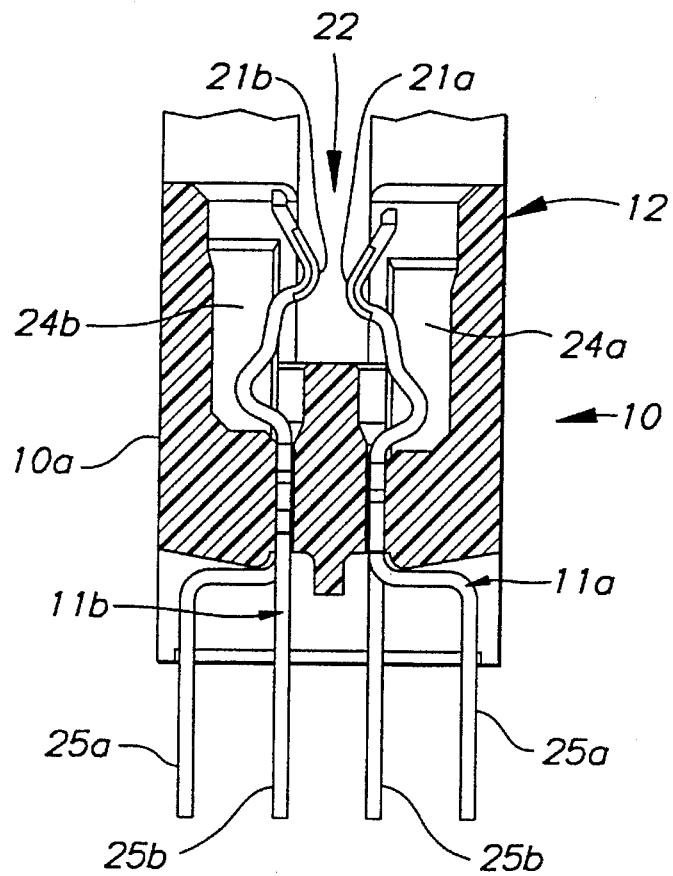
FIG. 4 is a cross-sectional taken along line 4—4 of FIG. 2.

FIG. 4 shows the arrangement of the electrical contacts 11a,11b in section 12. Electrical contacts 11a, 11b are arranged in two rows. When the card 200 is inserted in the connector it is disposed between these two rows of contacts. The contact sections 21a, 21b of the electrical contacts are offset in the vertical direction relative to each other. This is done to make the insertion of the card 200 in the receiving opening 22 easier. In the connector section 12, two types of cavities 24a, 24b accommodate contact sections 21a,21b of electrical contacts 11a, 11b. Legs 25a, 25b of the electrical contacts 11a, 11b are bent in such a manner as to form four rows as shown in FIG. 4.

Figure 11:
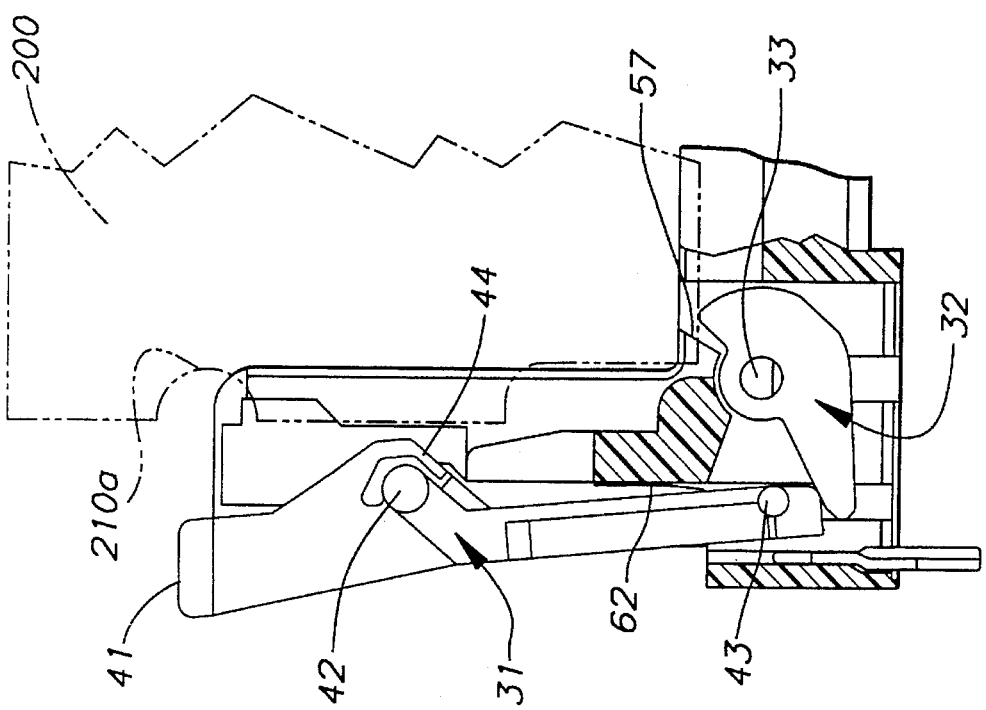
FIG. 11 is a view similar to FIG. 9 wherein the card is ejected.
Figure 10:
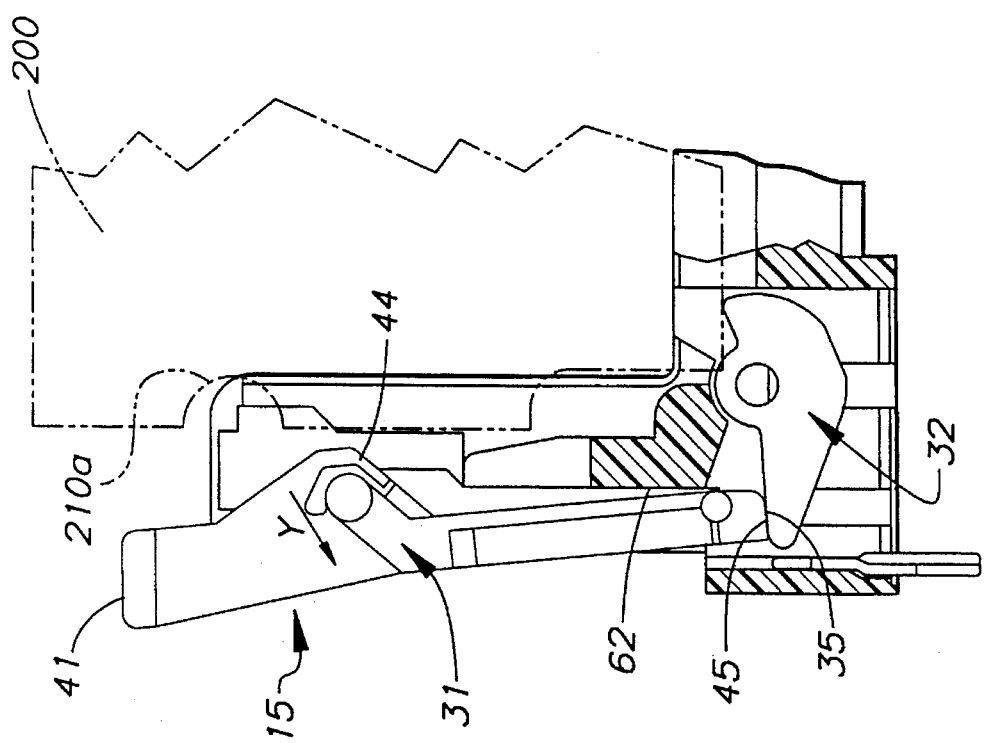
FIG. 10 is a view similar to FIG. 9 wherein the card is in the process of ejection.

FIGS. 9–11 show the ejection mechanism 15 contained in the guide post 13a of the card-edge connector. The ejection mechanism 15 includes a push bar 31 and a rotational cam member 32 operated by the push bar 31. The push bar 31, slidably moves inside a groove in the guide post 13a.

Figure 5:
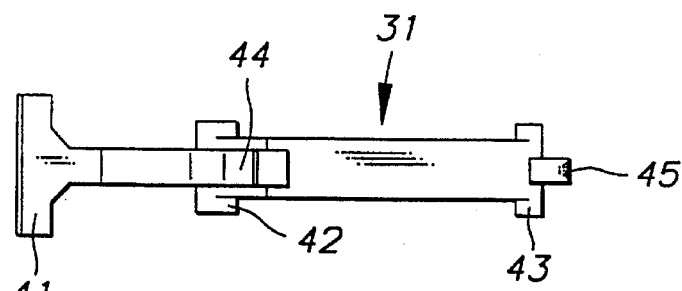
FIG. 5 is a top view of a push bar used in the card-ejection mechanism of FIG. 1.
Figure 6:
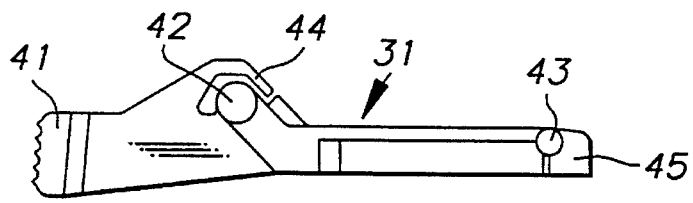
FIG. 6 is a side view of the push bar of FIG. 5.

Configuration of the push bar 31 is shown in FIGS. 5 and 6. The push bar 31 is an integral unit including a lever 41, primary lugs 42, secondary lugs 43 and a card-retaining arm 44. The card-retaining arm 44 is a resilient member. When the card 200 is inserted in the connector 10, the card-retaining arm 44 engages the cutout 210a and retains the card in the connector (FIG. 9). The primary lugs 42 and secondary lugs 43 are used for the purpose of guiding the push bar 31 during its movement in guide post 13a.

FIGS. 7 and 8 show the configuration of the cam member 32. The cam member 32 has a hollow cavity inside so that it can accommodate a corner of the card 200. A pair of journals 33 extend outwardly from walls 34 of the cam member. The journals 33 form the center of rotation of the cam member 32.

FIGS. 9–11 illustrate the operation of the ejection mechanism 15. As noted above, in FIG. 9, the ejection mechanism 15 is shown when the card 200 is in the fully inserted position in the connector. The outline of the card is shown by a broken line. In this position, the card-retaining arm 44 of the push bar 31 is latched in the cutout 210a of the card 200, thus retaining it in the connector. A corner edge of the card 200 is in the cavity of the cam member 32. The center of rotation of the cam member 32, that is the journals 33, are practically in the same location of the connector section 12 as the corner of the card. Movement of the cam member 32 is limited by a first restraining surface 56. The card 200 is ejected by applying downward pressure to the push bar 31.

In FIG. 10, the ejection mechanism 15 is shown in the process of card ejection. The push bar 31 is pushed downward and it begins to tilt outwardly, due to the interaction of the first set of lugs 42 and the groove (not shown) in the guide post 13a. As the mechanism changes its state from the configuration shown in FIG. 9 to the position shown in FIG. 10, the first set of lugs 42 starts to move in the direction shown by the arrow Y, while the second set of lugs 43 moves along the inner wall 62. The guide post 13a has a slot 53 (FIG. 9) through which the push bar 31 can slide outside the guide post. Because of this, the card retaining arm 44 disengages from the cutout 210a of the card 200. When the push bar 31 is pushed farther down, its operating surface 45 bears against the shoulder 35 of the cam member, which causes the rotation of the cam member 32, thus displacing the card 200 upwardly.

FIG. 11 illustrates the ejection mechanism 15 when ejection of the card is completed. Due to the movement of the push bar 31, the cam member 32 engages the second restraining surface 57, thus sufficiently lifting the card 200 so that it can be easily pulled out by hand without any damage to the components of the card.

The above explanations relate to the process of ejection of the card 200. The insertion of the card is carried out in the reverse order, whereby the cam member 32 is pushed down by the card; which, in turn, moves the push bar 31 upwardly. The push bar 31 slides inside the guide post 13a, and the card-retaining arm 44 resiliently engages the cutout 210a of the card 200.

FIGS. 12–24 represent the second embodiment of the card-edge connector 70 with ejection mechanism 75. The card-edge connector 70 includes a connector section 72 in which electrical contacts 71a, 71b are arranged and guide posts 73a and 73b are located at both ends of the connector section 72. Similar to the first embodiment, the function of the guide posts 73a and 73b is to guide the card 200 into the connector section 72.

Figure 14:
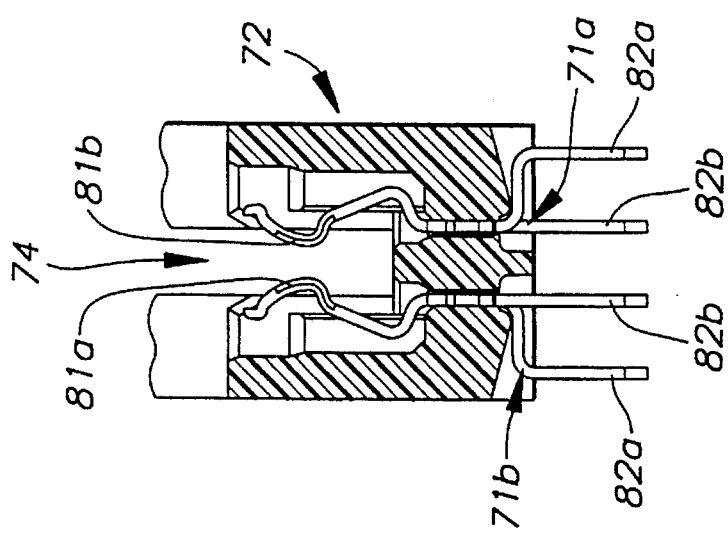
FIG. 14 is a cross-sectional view taken along line 14—14 of FIG. 13.

FIG. 14 represents a cross section of the connector section 72. The contacting sections of the card 200 make electric contact with the contacting sections 81a, 81b of the electrical contacts 71a, 71b. The electrical contacts 71a, 71b are arranged in symmetrically opposed positions and have differently shaped legs 82a, 82b forming separate rows as shown.

Figure 12:
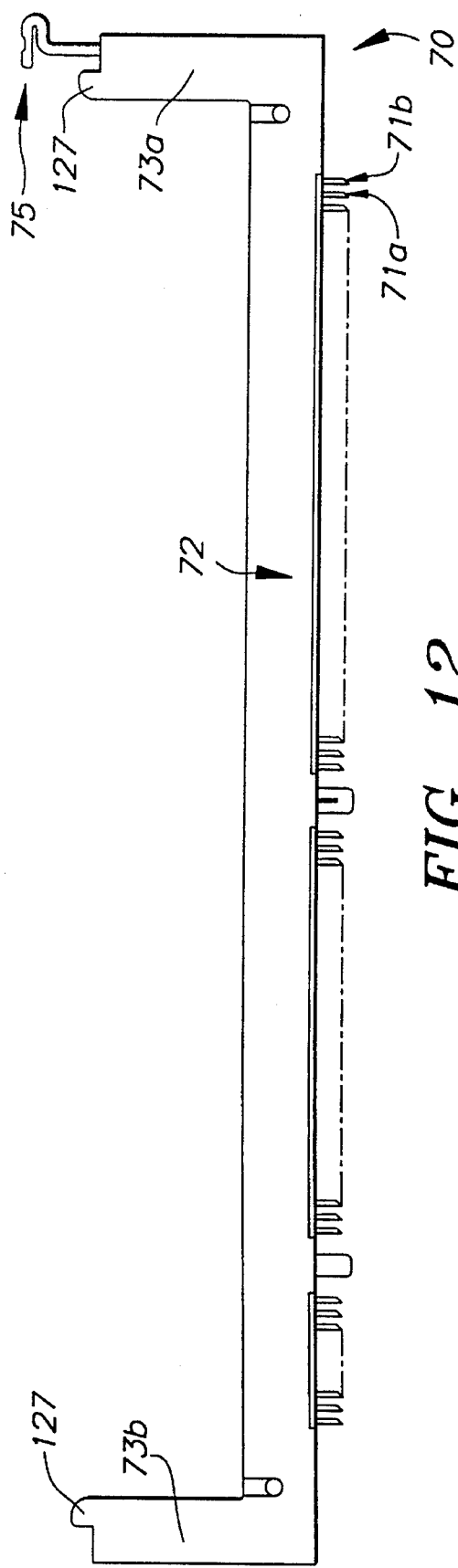
FIG. 12 is a side view of a second embodiment of the card-edge connector with an ejection mechanism.
Figure 13:
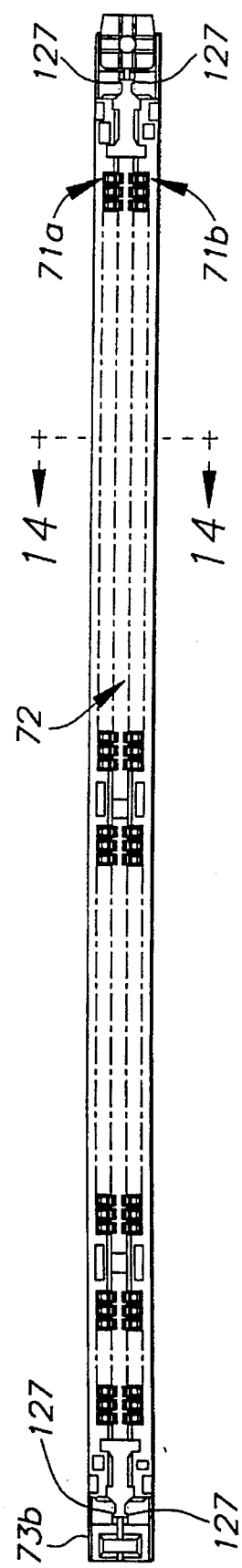
FIG. 13 is a top view of the connector of FIG. 12.

As can be seen from the FIG. 12, an ejection mechanism 75 is mounted in at least one of the guide posts 73a or 73b (in this case, in the guide post 73a).

According to FIGS. 15–22, the ejection mechanism 75 includes a push bar 91 and a cam member 92. The push bar 91 and the cam member 92 are linked as in the first embodiment, and the operating surface 108 (FIGS. 21 and 22) of the push bar 91 is pressed against the shoulder 115 of the cam member 92. The push bar 91 of the second embodiment moves along a straight line and operates the cam member 92 by interacting with it. The guide post 73a has a slot 117 (FIG. 15) which, as it will be explained below, makes it possible for the push bar to slide relative to guide post 73a.

Figure 21:
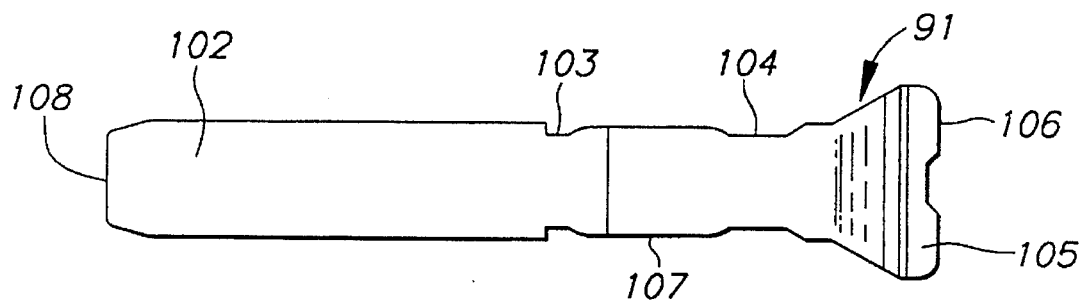
FIG. 21 is a top view of the push bar of the ejection mechanism of FIG. 12.
Figure 22:
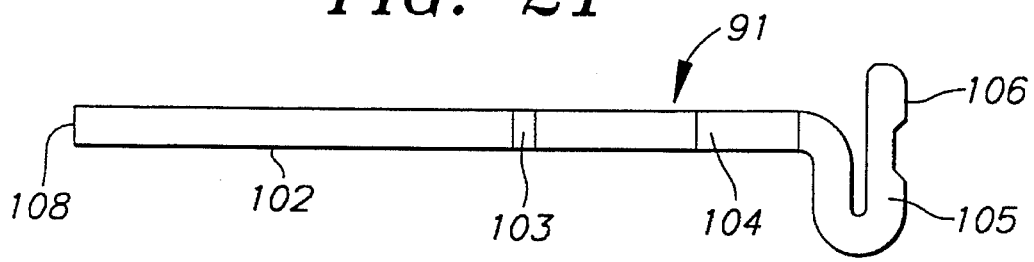
FIG. 22 is a side view of the push bar of FIG. 21.

As can be seen from FIGS. 21–22, the push bar 91 is an integral unit comprising a tab section 102, primary notches 103, secondary notches 104 and an operating section 105. A planer section 107 is located between the primary notches 103 and secondary notches 104. On the operating surface 106 of the operating section 105, a straight or a crossed slot (not shown) is provided for a screw driver or some other tool.

Figure 23:
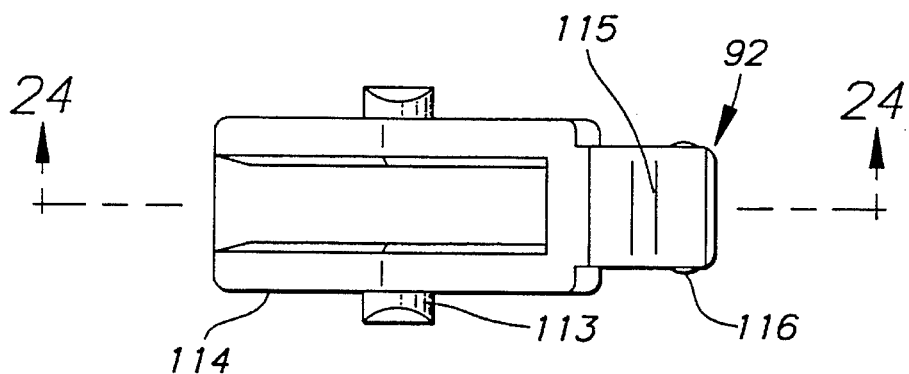
FIG. 23 is a top view of the cam member of the ejection mechanism of FIG. 12.
Figure 24:
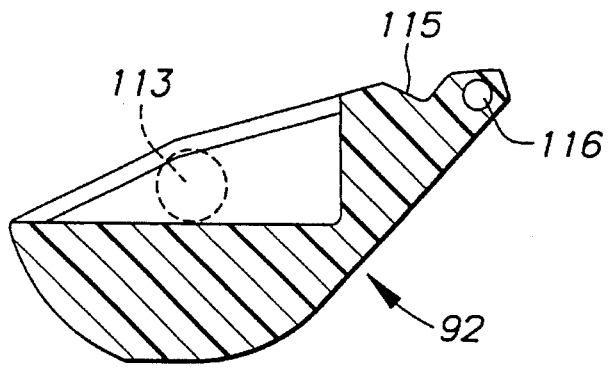
FIG. 24 is a cross-sectional view taken along line 24—24 of FIG. 23.

FIGS. 23–24 illustrate the configuration of the cam member 92. The cam member 92 is hollow like the cam member 32 of the first embodiment. Therefore, when the card 200 is inserted in the connector, its corner fits in the cam member cavity. The cam member also has a pair of journals 113 forming its center of rotation which extend from the side walls 114 thereof. The cam member also has detents 116 making it possible to tactilely determine the moment of ejection.

Figure 16:
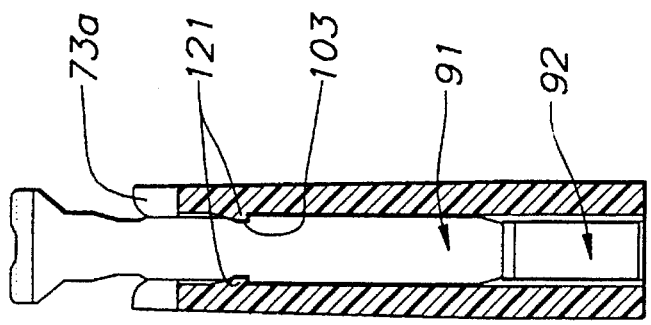
FIG. 16 is a partly-sectioned view of the guide post of the ejection mechanism shown in FIG. 12 when the auxiliary card is completely inserted.
Figure 15:
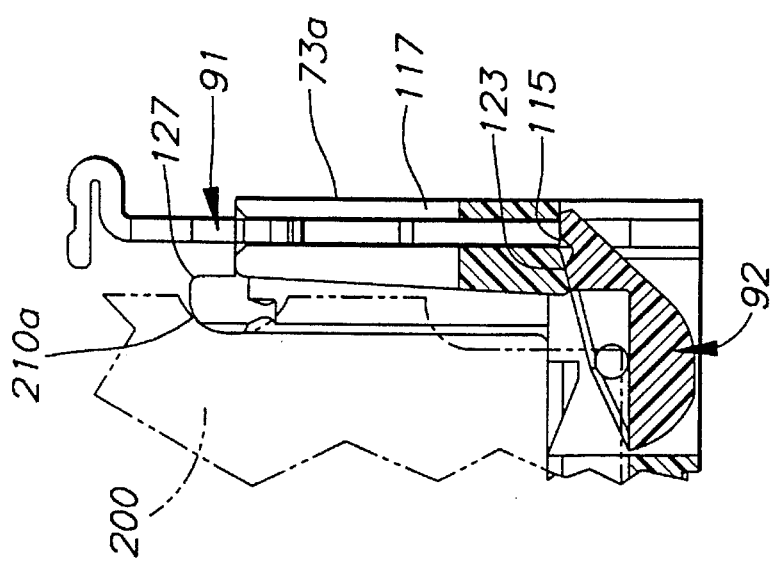
FIG. 15 is a partly-sectioned view of the guide post of the ejection mechanism shown in FIG. 12 when the card is completely inserted.

FIGS. 15–16 depict the push bar 91 and the cam member 92 in the position when the card 200 is completely inserted. According to FIG. 15, the cam member 92 is in the position whereby it is in engagement with the first-restraining surface 123. The guide post 73*a*, which is resilient due to the slot 117, has on its inside surface two opposed lugs 127 (FIG. 13) similar to the lugs 17 of the first embodiment. In the position shown in FIG. 15, lugs 127 are disposed in the cutout 210*a* of the card 200. In addition, in this embodiment, similar lugs 127 are made in the guide post 73*b* as well.

As can be seen from FIG. 16, a pair of lugs 121 are located in the guide post 73*a* for the purpose of retaining the push bar 91 in a primary position. Lugs 121 of the guide post 73*a* engage with the primary notches 103 thereby maintaining the push bar 91 in the primary position.

Figure 17:
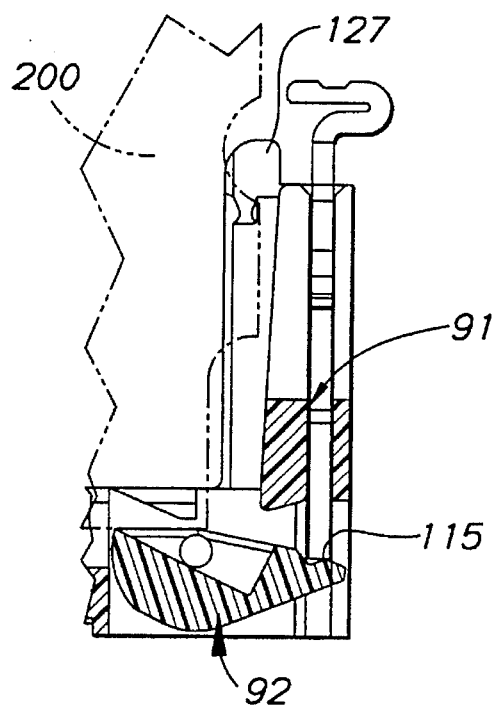
FIG. 17 is a partly-sectioned view similar to FIG. 15 showing the ejection mechanism of FIG. 12 in the process of ejection.
Figure 18:
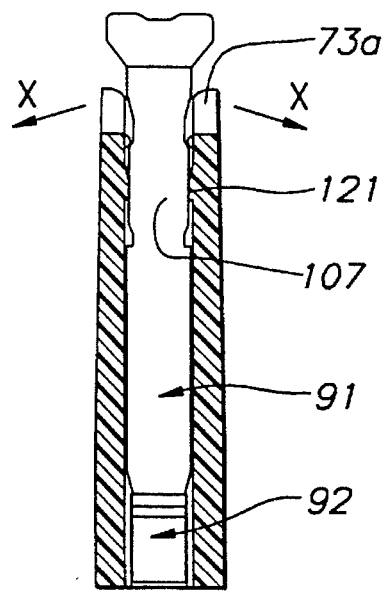
FIG. 18 is a partly-sectioned view similar to FIG. 16 showing the ejection mechanism of FIG. 12 in the process of ejection.

FIGS. 17 and 18 show the connector with the card 200 in the process of ejection. In this position, the lugs 121 engage the planer section 107 which causes the walls of the guide post 73*a* to move outwardly in the direction shown by the arrows X in FIG. 18, thus releasing the lugs 127 from the cutout 210*a* thereby facilitating the ejection of the card. In addition, as can be seen from FIG. 17, rotation of the cam member 92 creates a force pushing the card 200 upward.

Figure 19:
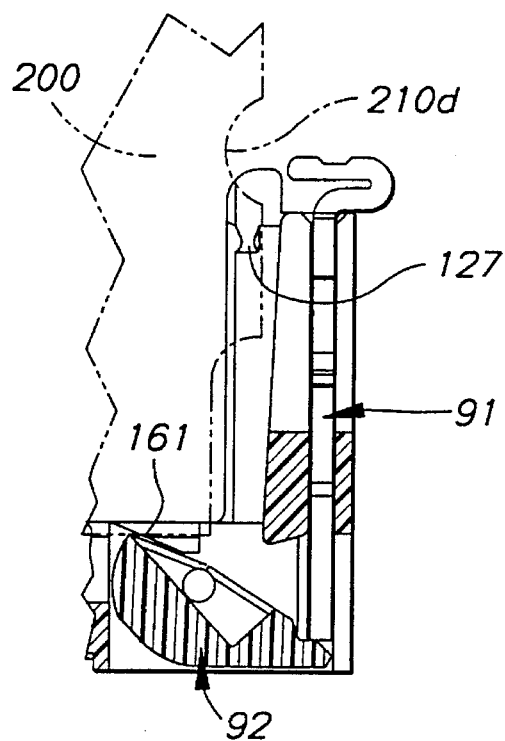
FIG. 19 is a partly-sectioned view similar to the FIG. 15 showing the ejection mechanism of FIG. 12 at the completion of ejection.
Figure 20:
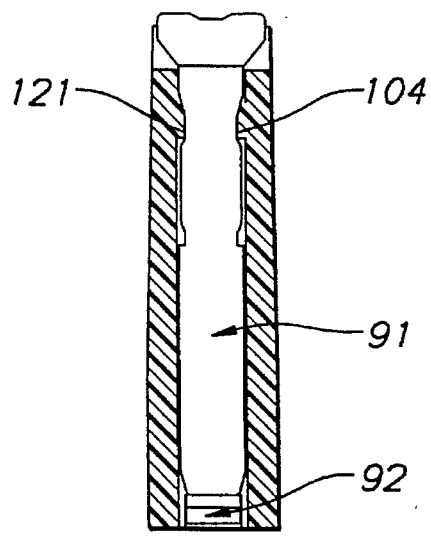
FIG. 20 is a partly-sectioned view similar to the FIG. 16 showing the ejection mechanism of FIG. 12 at the completion of ejection.

FIGS. 19 and 20 depict the card at the final stage of ejection. As can be seen from FIG. 19, in the final position, the secondary notches 104 engage lugs 121, thus retaining the push bar 91 in the secondary position. The cam member 92, as shown in FIG. 19, is turned as far as it can move against secondary-restraining surface 161.

Above, the ejection of the card 200 has been explained, and the insertion of the card 200 is carried out in a reverse order. That is, the corner of the card pushes the cam member 92 down, thus moving the push bar 91 from the secondary position to the primary position. In the intermediary position between the secondary and the primary positions, the planer section 107 performs the function of spreading the guide post, thus facilitating the insertion of the card.

Due to the fact that the operating element of the ejection mechanism is located on the upper surface of a guide post, the card-edge connector with ejection mechanism according to this invention is easy to operate and the surface of the card can be used with a higher efficiency.

In addition, the card-edge connector with ejection mechanism according to this invention has a retaining device for a reliable retention of the card in the connector as well as a means for ejecting the card. In the first embodiment, the retaining device is an integral part of the push bar. During ejection, the push bar moves along a path determined by a guiding groove in the guide post and releases the retaining device. In the second embodiment, the retaining device comprises two mutually opposed lugs in the guide posts. During ejection, the push bar interacts with the guide post and releases the retaining device by moving the opposed lugs apart. The release of the retaining device of both comes into action simultaneously with the operation of the ejection mechanism, thus making it possible to release and eject the card in only one motion. Therefore, the card-edge connector with ejection mechanism according to this invention allows for a reliable retention of cards and their smooth ejection.

We claim:

1. A card-edge connector comprising:

a insulative housing having guide posts at each end that can receive a card;

a plurality of electrical contacts secured in said housing; and an ejection mechanism comprising a push bar movable inside one of said guide posts and a cam member mounted in said housing engagable by said push bar transforming movement of said push bar into a force to a corner edge of said card to eject said card upwardly, said push bar including a lever for applying force to the push bar, a pair of primary lugs and a pair of secondary lugs that engage a groove in said guide post, and a retaining device that engages a cutout notch in the card and retains the card in place.

2. A card-edge connector as claimed in claim 1, wherein the guide post without said ejection mechanism has a slot giving the guide post flexibility to allow the card to be inserted and mutually opposed lugs provided by said guide post that engage and retain the card.

3. A card-edge connector as claimed in claim 1, wherein said electrical contacts in said housing are in two rows and are offset in the vertical direction.

4. A card-edge connector as claimed in claim 1, wherein said cam member includes a cavity to receive the corner edge of the card and a pair of journals about which said cam member rotates.

5. A card-edge connector as claimed in claim 1, wherein said housing includes a first restraining surface and a second restraining surface included as part of said guide post and said housing to restrict the movement of said cam member between said first and second restraining surfaces.

6. A card-edge connector as claimed in claim 1, wherein said guide post with said ejection mechanism includes a slot that allows part of said push bar to move outward from the guide post.

7. A card-edge connector comprising:

a insulative housing having guide posts at each end that can receive a card;

a plurality of electrical contacts secured in said housing; and an ejection mechanism comprising a push bar movable along a straight grove inside one of said guide posts and a cam member mounted in said housing engagable by said push bar transforming movement of said push bar into a force to a corner edge of said card to eject said card upwardly, said push bar including a tab, a pair of primary notches, a pair of secondary notches, a lever and a planner section in between said primary notches and said secondary notches.

8. A card-edge connector as claimed in claim 7, wherein each said guide post includes a resilient slot with a pair of opposed lugs on an inside surface of said guide post that engage the card.

9. A card-edge connector as claimed in claim 7, wherein the guide post without said ejection mechanism has a slot gibing the guide post flexibility to allow the card to be inserted and mutually opposed lugs provided by said guide post that engage and retain the card.

10. A card-edge connector as claimed in claim 7, wherein said cam member includes a pair of detents to tactilely determine the moment of ejection of the card.

11. A card-edge connector as claimed in claim 10, wherein said guide post includes a pair of retaining lugs that engage said primary notches when said push bar is in a primary position and said secondary notches when said push bar is in a secondary position.

* * * * *